(12) United States Patent
Dahlqvist et al.

(10) Patent No.: US 6,524,900 B2
(45) Date of Patent: Feb. 25, 2003

(54) METHOD CONCERNING A JUNCTION BARRIER SCHOTTKY DIODE, SUCH A DIODE AND USE THEREOF

(75) Inventors: Fanny Dahlqvist, Johanneshov (SE); Heinz Lendenmann, Stocksund (SE); Willy Hermansson, Västerås (SE)

(73) Assignee: ABB Research, LTD, Zurich (CH)

( * ) Notice: Subject to any disclaimer, the term of this patent is extended or adjusted under 35 U.S.C. 154(b) by 0 days.

(21) Appl. No.: 09/911,479

(22) Filed: Jul. 25, 2001

(65) Prior Publication Data
US 2003/0020133 A1 Jan. 30, 2003

(51) Int. Cl.⁷ .............................. H01L 21/338
(52) U.S. Cl. ................ 438/167; 438/237; 438/328; 438/431
(58) Field of Search ................... 438/105, 167, 438/170, 237, 328, 931; 257/109, 471

(56) References Cited

U.S. PATENT DOCUMENTS 5,902,117 A * 5/1999 Rottner et al. ............. 438/105

FOREIGN PATENT DOCUMENTS

WO WO98/32177 * 7/1998 ......... H01L/29/872

* cited by examiner

Primary Examiner—Carl Whitehead, Jr.
Assistant Examiner—Yennhu B. Huynh
(74) Attorney, Agent, or Firm—Dykema Gossett, PLLC

(57) ABSTRACT

A method for controlling the temperature dependence of a junction barrier Schottky diode of a semiconductor material having an energy gap between the valence band and the conduction band exceeding 2 eV provides for doing this when producing the diode by adjusting the on-state resistance of the grid portion of the diode during the production for obtaining a temperature dependence of the operation of the diode adapted to the intended use thereof.

22 Claims, 2 Drawing Sheets

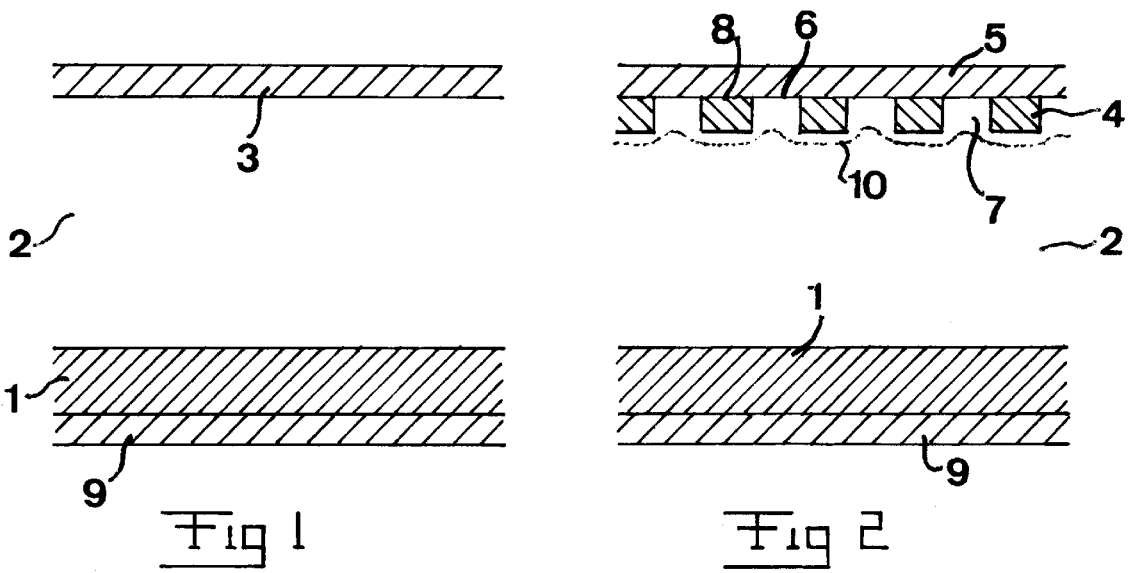
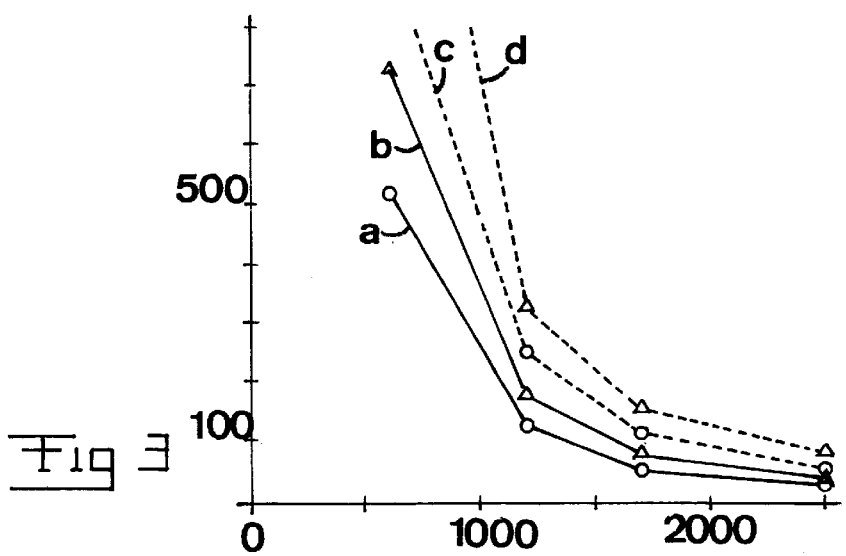
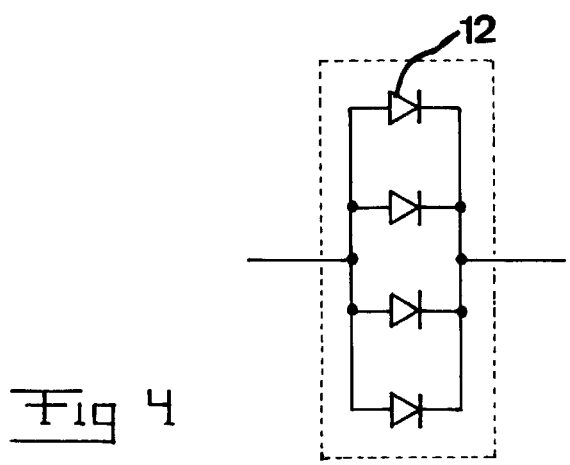
Fig 1
Fig 2
Fig 3
Fig 4

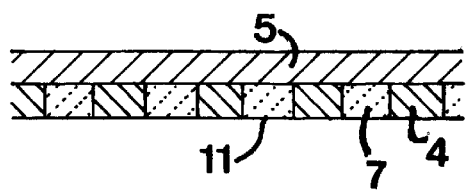 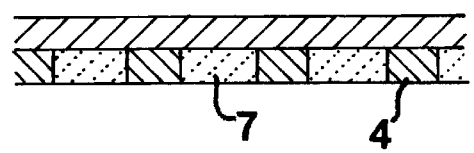
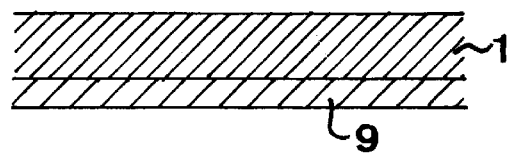 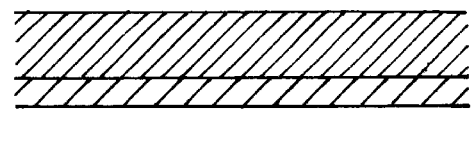
Fig 5     Fig 6
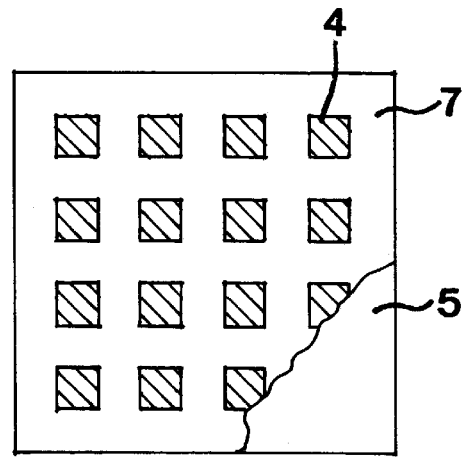 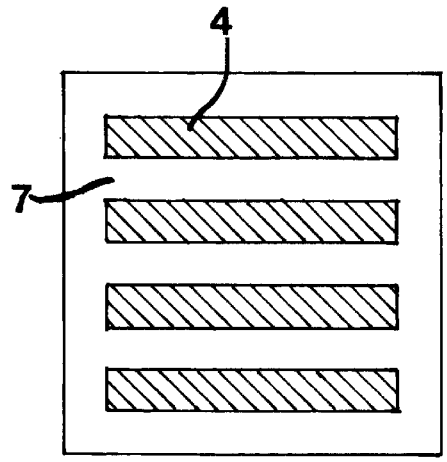
Fig 7a     Fig 7b
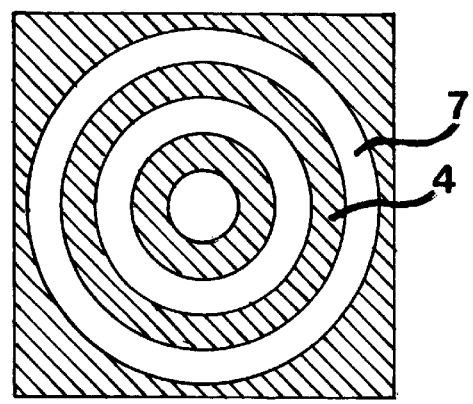 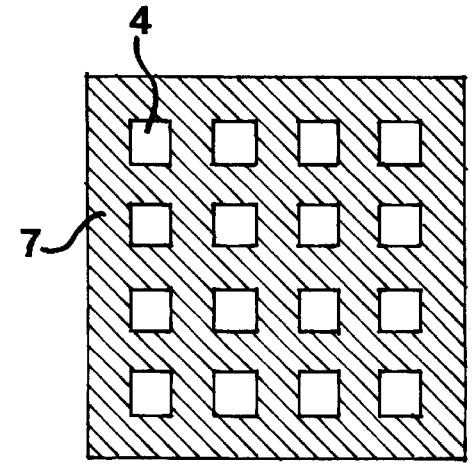
Fig 7c     Fig 7d

METHOD CONCERNING A JUNCTION BARRIER SCHOTTKY DIODE, SUCH A DIODE AND USE THEREOF

TECHNICAL FIELD OF THE INVENTION AND PRIOR ART

The present invention relates to a method for controlling the temperature dependence of a junction barrier Schottky diode of a semiconductor material having an energy gap between the valence band and the conduction band exceeding 2 eV. No such method is known today, and the formulation of the goal to obtain such a method constitutes a part of the present invention.

A junction barrier Schottky diode is already known through U.S. Pat. No. 6,104,043. That diode is made of SiC, which belongs to the wide band gap materials to which the present invention is directed. The present invention is directed to junction barrier Schottky diodes of all materials having a said energy gap exceeding 2 eV, such as SiC, diamond, AlN etc, but it is particularly directed to such diodes of SiC, so that the present invention will hereinafter be discussed for that material so as to illuminate, but not in any way restrict, the invention and the problems to be solved thereby.

SiC has some excellent physical properties, among which a high breakdown field being approximately ten times higher than for Si may be mentioned. These properties make SiC well suited as a material for power devices operating under conditions where high voltages may occur in the blocking state of the device. Due to the large band gap of SiC a Schottky diode made of this material has particular advantages with respect to on-state losses compared to a pin-diode made of SiC, since the forward voltage drop of a pn-junction is very large for SiC as compared to for example Si. This is valid for blocking voltages below a predetermined level, above which pin-diodes of SiC have a lower on-state voltage. Furthermore, by arranging laterally spaced emitter layer regions for forming a junction barrier Schottky diode a pn-junction-behaviour will result in the blocking state of the device thanks to the pinching off of the Schottky region resulting in low leakage currents. Furthermore, such a diode and systems made with these diodes of SiC will have very low switching losses at higher frequencies thanks to the low reverse recovery charge of SiC in comparison to Si and that a Schottky diode has no minority charge carriers which have to recombine as in a pin-diode.

In some applications it is important and even necessary that the diode has a positive temperature coefficient, i.e. the on-state voltage thereacross increases with the temperature, since the current through the diode may otherwise run away and destroy the diode and possibly other equipment associated therewith. This is in particular the case when connecting a number of such diodes in parallel. This is no problem for such a diode of Si, since the resistance of the drift layer totally dominates, so that the temperature coefficient will be positive already for low current densities. However, diodes of wide band gap materials, such as SiC, require a much thinner drift layer due to the high dielectric strength of SiC, so that the contribution of the resistive voltage drop of the drift layer to the total on-state voltage will be relatively smaller than for a device of Si. Instead the Schottky barrier dominates and the contribution thereof results in a negative temperature coefficient. This means that Schottky diodes of SiC made for blocking comparatively low voltages in the blocking state thereof and accordingly being very thin, may not have a positive temperature coefficient until very high current densities, and the cross-over point where the temperature coefficient shifts from negative to positive may be as high as several hundreds of $A/cm^2$ in the case of SiC as compared to typically 30–250 $A/cm^2$ in the Si case. However, cooling aspects as well as encapsulation problems normally require an average current density not being much higher than 100–200 $A/cm^2$. A solution to this problem would be to use thicker SiC diodes being dimensioned for blocking very high voltages also in cases where no such high voltages have to be blocked. However, this would mean that a great deal of the advantage of SiC would be lost and the static operation losses would increase enormously. Furthermore, such diodes would be much more costly than diodes made for lower blocking voltages.

SUMMARY OF THE INVENTION

The object of the present invention is to find a solution to the problems mentioned above.

The present inventors have understood that a junction barrier Schottky diode results in totally new possibilities to control the temperature dependence of a Schottky diode without influencing the switching losses or even the static losses thereof considerably.

Accordingly, the present invention provides a method of the type defined in the introduction, in which the following steps are carried out when producing the diode:

1) epitaxially growing on top of each other the following semi-conductor layers of said material: a substrate layer being highly doped according to a first conductivity type, n or p, and a drift layer being low doped according to said first conductivity type, 2) introducing dopants of a second conductivity type, n or p, opposite to the first conductivity type into the drift layer in regions laterally spaced to form doped emitter layer regions in the drift layer at a vertical distance from the substrate layer for defining a grid portion of the diode there, and 3) applying a metal layer on top of the drift layer to make a Schottky contact thereto and on top of at least one of the emitter layer regions to make a contact thereto, wherein at least step 2) is carried out for adjusting the on-state resistance of the grid portion of the diode for obtaining a temperature dependence of the operation of the diode adapted to the intended use thereof.

Accordingly, the invention resides in the understanding that it is possible to control the temperature dependence of a junction barrier Schottky diode by adjusting the on-state resistance of the grid portion of the diode when producing the diode. It has been found that the resistance of the grid portion of a junction barrier Schottky diode of a wide band gap material may be adjusted in such a degree when producing the diode that the total resistance of the diode may be considerably changed, so that said cross-over point between a negative and a positive temperature coefficient may be moved drastically. Furthermore, it will be possible to change the value of the temperature coefficient in this way.

It is possible in this way to change the total resistance of a low blocking voltage junction barrier Schottky diode considerably by changing the on-state resistance of the grid portion, since it constitutes a considerable part, sometimes the major part, of the total on-state resistance. In the case of a junction barrier Schottky diode of SiC for 600–1700 V the resistive contribution from the grid portion is typically 80% of the total on-state resistance. Accordingly, it will be possible to change the on-state resistance of the diode considerably by changing the resistance of the grid portion while substantially not influencing the switching losses of the diode, since the thickness and/or the doping of the drift layer does not have to be changed. Accordingly, said cross-over point of the temperature coefficient of the diode may be lowered considerably without making the drift layer thicker.

Thus, the temperature behaviour may be optimized independently of the drift layer. This method may also be used to control the capacitive behaviour of the diode for minimizing unwanted oscillations in a circuit in which the diode may be built in. "Temperature dependence of the operation" as used here is accordingly intended to also cover that case.

According to a preferred embodiment of the invention the method is carried out for producing a diode to be connected in a package in parallel with other such diodes for sharing an on-state current through said package, and step 2) is carried out for adjusting the resistance of the grid portion of the diode for obtaining that the temperature coefficient of the diode will be positive or nearly positive at the intended current density and voltage blocking capability of the diode. Paralleling of many chips of such diodes is important in many applications, such as in power converters, since the size of each chip is still very small, for achieving high currents in the range of for example 100 A. As mentioned above, a positive temperature coefficient for the current density in question is often a condition for such paralleling, and this may be achieved also for low current densities for diodes with low voltage blocking capability in this way. "Nearly positive" means that it may be possible to in this way obtain a temperature coefficient being less negative and by that use for example 250 V diodes of SiC for paralleling under certain conditions.

According to another preferred embodiment of the invention the resistance of the grid portion of the diode is in step 1) adjusted by adjusting the doping concentration of drift layer regions later in step 2) becoming a part of said grid portion. The resistance of the grid portion may in this way be increased by decreasing the doping concentration of said drift layer regions and conversely. Another positive effect of this lower doping concentration in the grid portion is a higher yield of the diodes, since other negative effects in the surface region of the diode are reduced by that.

According to another preferred embodiment of the invention the relation between the lateral cross section area of said drift layer regions of the grid portion with respect to the total lateral cross section area of the diode is in step 2) adjusted for adjusting the resistance of the grid portion. It has been found that this relation is another parameter crucial for the resistance of the grid portion and which may be changed without substantially influencing the switching losses of the diode.

According to another preferred embodiment of the invention the doping concentration of the drift layer is increased with respect to the maximum doping concentration allowed for a diode without any grid portion for lowering the resistance of the drift layer and the on-state losses of the diode at a given voltage blocking capability of the diode. This embodiment is particularly well suited for blocking voltages as of which the unipolar drift resistance is the dominating part of the on-state resistance of the diode, which for SiC means a blocking voltage of 900 V and higher. It has been found that the different blocking mechanisms in the junction barrier Schottky diode compared to a normal Schottky diode allow a higher desired critical electric field in the junction barrier Schottky diode. This means that the resistance of the drift layer may be lowered, since for a given blocking voltage the doping concentration of the drift layer may be increased and thereby the drift layer may be made thinner. This results in a lower total forward voltage of the junction barrier Schottky diode compared to a normal Schottky diode and will influence the temperature dependence of the diode.

According to another preferred embodiment of the invention said material is SiC. This means that it will be possible to benefit from all the advantageous properties of SiC in a junction barrier Schottky diode.

According to another preferred embodiment of the invention a diode having a voltage blocking capability of 600–3500 V, preferably between 600 and 1500 V, is produced.

According to still another preferred embodiment of the invention a diode having the drift layer doped by donors is produced. This seems to be the most preferred doping type for the drift layer, although the invention is not restricted thereto, but it also comprises the use of acceptors as dopants for the drift layer and thereby hole conduction.

The invention also relates to a junction barrier Schottky diode produced by carrying out a method according to the present invention.

Furthermore, the invention relates to a use of a junction barrier Schottky diode produced by carrying out a method according to the invention in a package in parallel with other such diodes for sharing a current through this package, which may for blocking voltages of 1200–1800 V be possible also for current densities being as low as 150 A/cm$^2$ in the on-state of the diode. It will also be interesting to apply the method according to the invention on larger SiC chips with a cross section exceeding 10 mm$^2$.

Other advantages as well as advantageous features of the invention will appear from the following description and the other dependent claims.

BRIEF DESCRIPTION OF THE DRAWINGS

With reference to the appended drawings, below follows a specific description of preferred embodiments of the invention cited as examples.

In the drawings:

FIG. 1 is a schematic cross-section view of a conventional Schottky diode,

FIG. 2 is a view corresponding to FIG. 1 of a Junction Barrier Schottky diode (JBS) according to a first preferred embodiment of the invention, FIG. 3 is a graph illustrating the current density at the cross-over point of the temperature coefficient from negative to positive of different semiconductor devices versus the blocking voltage for which they are dimensioned, FIG. 4 illustrates very schematically a preferred use of a low blocking voltage junction barrier Schottky diode according to the present invention, FIG. 5 is a view corresponding to FIG. 2 of a junction barrier Schottky diode according to a second preferred embodiment of the invention, FIG. 6 is a view corresponding to FIG. 2 of a junction barrier Schottky diode according to a third preferred embodiment of the invention, and FIGS. 7a–7d are schematic views from above illustrating some possible designs of a junction barrier Schottky diode according to the present invention.

DETAILED DESCRIPTION OF PREFERRED EMBODIMENTS OF THE INVENTION

For better understanding the idea of the present invention a conventional Schottky diode is firstly shown in FIG. 1.

This Schottky diode of SiC has a highly doped n-type substrate layer 1 and a low doped n-type drift layer 2 on top thereof. A metal layer 3 forming a Schottky contact to the drift layer 2 is applied on top of the latter. If this Schottky diode is made of SiC and for comparatively low blocking voltages, for instance below 2000 V, the drift layer 2 may be made very thin resulting in very low on-state losses, but also in a negative temperature coefficient for the current densities normally of interest. The cross-over point at which the temperature coefficient changes from negative to positive may be lowered by making the drift layer thicker, which will then, as already stated above, substantially increase the on-state losses of the diode.

The present inventors have found that a junction barrier Schottky diode as illustrated in FIG. 2 opens new possibilities to move said cross-over point of the temperature coefficient without substantially influencing the switching losses of the diode and the on-state losses thereof will neither be changed that much. First of all, the structure and function of a diode of this type known from for instance U.S. Pat. No. 6,104,043, will be described. The constitution of this diode will be clear from the following description of a method used for its production. This method also comprises masking and demasking steps as well as annealing step after implantation, which however will not be further described here. First a highly doped n-type substrate layer 1 and a low doped n-type drift layer 2 of SiC are epitaxially grown, preferably by Chemical Vapour Deposition, on top of each other. Any suitable donor, such as nitrogen and phosphor, may be used to obtain the doping of these layers. Typical doping concentrations may be $10^{15}$–$10^{16}$ cm$^{-3}$ and $10^{18}$–$10^{20}$ cm$^{-3}$ for the drift layer and the substrate layer, respectively. After applying a suitable mask on top of the drift layer and appropriate patterning thereof a p-type dopant, such as boron or aluminium, is implanted into the drift layer in regions 4 laterally spaced to form doped p-type emitter layer regions in the drift layer at a vertical distance from the substrate layer 1. The regions 4 are mostly highly doped, but low doped is a conceivable alternative. In the case illustrated in FIG. 2 a conventional acceleration energy for the implant is used, such as 300 keV, which results in comparatively shallow emitter layer regions having a depth of about 0.3 $\mu$m when Al is implanted and 0.6 $\mu$m for B, which is to be compared with the thickness of the drift layer 2, which is typically about 5–50 $\mu$m. The doping concentration in the emitter layer regions may typically be $10^{16}$–$10^{20}$ cm$^{-3}$. The spacing between adjacent emitter region layers is typically 4–12 $\mu$m for a diode made for blocking 250–2500 V.

After an annealing step for making the implanted dopants electrically active and removal of the mask used, a metal layer 5 is applied on top of the drift layer 2 to make a Schottky contact 6 thereto in drift layer regions 7 between adjacent emitter layer regions and on top of the emitter layer regions 4 to make an ohmic contact 8 thereto. Two different metals may be used for obtaining the ohmic and the Schottky contacts. However, it is also possible to use the same metal for this, and it is even possible to let the contact 8 be a Schottky contact. The ohmic contact and the Schottky contact form the anode of the diode, whereas a corresponding metal layer 9 forms the cathode of the diode and is applied under the substrate layer.

The function of this diode is certainly clear from above, but it will be briefly repeated. In the forward conducting state of the diode it will due to the lower Schottky barrier (about 0,7–1 V) than the pn-barrier (about 2.2–2.5 V) function as a Schottky diode at lower current densities, so that the on-state losses will be lower than for a pn-diode. There will also at such lower current densities be no injection of minority charge carriers from the emitter layer regions into the drift layer which means that switching losses due to reverse recovery charge will be neglectible. At high current densities minority charge carriers may be injected from the emitter layer regions into the drift layer and the characteristic of the diode will come to closer to that of a pn-diode. This is an advantage for surge current capability of the device. In the reverse blocking state of the diode, accordingly, when the metal layer 5 is connected to a negative potential, the emitter layer regions will due to the low doping of the drift layer regions 7 easily deplete them and form a continuous depleted region therebetween, as indicated by the dashed line 10. This means that the diode will get the character of a conventional pn-diode and the field concentrations will be at the pn-junction and kept away from the Schottky contact 6. Thus, the diode will have a much lower leakage current at high voltages than a conventional Schottky diode. The doping concentration of the drift layer regions 2 and 7 may be varied continuously so that the doping concentration is reduced when the distance to the surface is reduced. This facilitates spreading of the depleted region in the low doped region. The result will be a larger depleted region closest to the surface, making the shielding of the Schottky contact easier, since a depleted region extending between the p-islands is formed earlier, i.e. at a lower voltage.

These different designs of a junction barrier Schottky diode of this type appear from the US Patent mentioned above. The present inventors have found that it is possible to a large extent control the temperature dependence of the operation of a Schottky diode of this type without substantially influencing the switching losses and the static losses of the diode. Especially for diodes for lower blocking voltages, i.e. which for wide band gap materials have a comparatively thin drift layer 2, it is possible to change the total on-state resistance of the diode considerably by modifying the on-state resistance of the grid portion of the device formed by the emitter layer regions 4 and the drift layer regions 7 separating them.

FIG. 3 illustrated at which current densities the cross-over point, i.e. where the temperature coefficient changes from negative to positive, is located for different diodes being designed for blocking different voltage in the blocking state thereof. The line a is a real junction barrier Schottky diode, b is an ideal junction barrier Schottky diode, c is a real Schottky diode and d is an ideal Schottky diode. Often a current density of 70–100 A/cm$^2$ is a maximum for taking care of cooling and encapsulation, and it appears that this means that diodes dimensioned for blocking at least 1500 V have to be used, even if there is no need of blocking voltages higher than for example 1000 V. However, it has been found that it is possible to substantially lower said cross-over point for lower blocking voltage capabilities by changing the on-state resistance of the grid portion of the diode, which resistance will then constitute a great part of the total on-state resistance of the diode. There are several ways of doing this, and the most important ones will be discussed further below.

FIG. 4 illustrates a use of a diode connected in parallel with other such diodes for sharing a current. This type of use of a diode requires a positive temperature coefficient for ensuring that the current will be uniformly distributed among the diodes 12 while avoiding run away of the current through any of them.

FIG. 5 illustrates how a method for controlling the temperature dependence of a junction barrier Schottky diode may be carried out when producing such a diode by adjusting the doping concentration of the drift layer regions 7 later in step 2) above becoming a part of the grid portion. Accordingly, the drift layer 2 may for example in the case of SiC as the semiconductor material of the diode be epitaxially grown while introducing donors at a concentration of $10^{16}$ cm$^{-3}$ until reaching the thickness (see line 11) where the grid portion is intended to start. The doping concentration is as of here reduced to $5 \times 10^{15}$ cm$^{-3}$ increasing the on-state resistance of the grid portion with respect to the case of the same doping concentration throughout the drift layer. It may, however, advantageously be as low as $10^{14}$ cm$^{-3}$. This means that the cross-over point at which the temperature coefficient changes from negative to positive will be moved to lower current densities, and the effect of this will be particularly large if the diode is made for low blocking voltages, where the on-state resistance of the grid portion constitutes a major part of the total on-state resistance of the diode. For SiC this means in the practice that for 600–1700 V diodes operating current densities can be designed with more freedom compared to similar Schottky diodes.

FIG. 6 schematically illustrates another possibility to control the temperature dependence of a junction barrier Schottky diode when producing it, and this diode differs from the one according to FIG. 5 by the fact that in step 2) the emitter layer regions are formed at larger lateral distances, so that the relation between the lateral cross section area of the drift layer regions 7 of the grid portion with respect to the total lateral cross section area of the diode will be increased resulting in a decrease of the resistance of the grid portion of the diode. More exactly, the relation is in FIG. 5 ½, whereas it is increased to ⅔ for the embodiment according to FIG. 6 resulting in an increase of the current density at which the temperature coefficient will change from negative to positive for a diode having a certain blocking capability.

FIGS. 7a–7d schematically illustrate some of a number of different options to design the grid portion of a junction barrier Schottky diode according to the present invention. FIG. 7a illustrates how the p-type emitter layer regions 4 have a square lateral cross-section and are surrounded by the n-type drift layer regions 7.

In the embodiment according to FIG. 7b the emitter layer regions are instead formed by lateral bars 4.

FIG. 7c shows how the grid portion may instead be formed by annular portions being alternatingly n-type and p-type doped.

Finally, it is illustrated in FIG. 7d that it will also be possible to reverse the doping types of the embodiment according to FIG. 7a, so that here the square portions are n-type doped and the surrounding part is p-type doped. It is then also well possible that the portions with square cross-section are also here emitter layer regions, so that this Schottky diode will have a drift layer being p-type doped.

The invention is of course not in any way restricted to the preferred embodiments described above, but many possibilities to modify them without departing from the basic idea of the invention as defined in the appended claims should be apparent to a person with ordinary skill in the art.

The number of layers mentioned in the claims is a minimum number, and it is within the scope of the invention to arrange further layers in the diodes or divide any layer into several layers by selective doping of different regions thereof. Especially the drift layer may be composed by sub-layers of different doping concentrations, such as particularly low doping concentration close to the emitter layer regions for facilitating the depletion of the drift layer there. It is for instance also possible to arrange a highly doped buffer layer between the substrate and the drift layer. This buffer layer will have the same conductivity doping type, n or p, as the drift layer.

The emitter layer regions may also be formed in bottom of trenches etched into the drift layer for increasing the vertical distance between the Schottky contacts and the junction barrier when the diode is reverse biased. It is also possible to obtain such vertical distance by using the regrowth technique and forming an ohmic contact to the emitter layer regions so buried.

What is claimed is:

1. A method for controlling the temperature dependence of a junction barrier Schottky diode of a semiconductor material having an energy gap between the valence band and the conduction band exceeding 2 eV, wherein the following steps are carried out when producing the diode:
   1) epitaxially growing on top of each other the following semi conductor layers of said material; a substrate layer being highly doped according to a first conductivity type, n or p, and a drift layer being low doped according to said first conductivity type,
   2) introducing dopants of a second conductivity type, n or p, opposite to the first conductivity type into the drift layer in regions laterally spaced to form doped emitter layer regions in the drift layer at a vertical distance from the substrate layer for defining a grid portion of the diode there, and 3) applying a metal layer on top of the drift layer to make a Schottky contact thereto and on top of at least one of the emitter layer regions to make a contact thereto, wherein step 2) is carried out for adjusting the on-state resistance of the grid portion of the diode for obtaining a temperature dependence of the operation of the diode resulting in a positive or nearly positive temperature coefficient at an operating current density and voltage blocking capability and wherein the diode is connectable in a package in parallel with other such diodes for sharing an on state current thorough the package adapted to the intended use thereof.

2. A method according to claim 1, wherein in step 2) the resistance of the grid portion is adjusted for obtaining a temperature coefficient within a determined range for said intended current density of the diode.

3. A method according to claim 1, wherein in step 1) the resistance of said grid portion of the diode is adjusted by adjusting the doping concentration of drift layer regions in layer step 2) becoming a part of said grid portion.

4. A method according to claim 3, in step 1) the doping concentration in said drift layer regions separating said emitter layer regions of the grid portion is adjusted to be lower than in the rest of the drift layer for increasing the resistance of the grid portion of the diode with respect to the case of the same doping concentration as in the rest of the drift layer.

5. A method according to claim 4, wherein said drift layer regions are given a doping concentration of less than about $10^{16}$ cm$^{-3}$, $5 \cdot 10^{14}$–$10^{15}$ cm$^{-3}$ or $10^{14}$–$5 \cdot 10^{14}$ cm$^{-3}$.

6. A method according to claim 1, wherein, in step 2) the relation between the lateral cross section area of said drift layer regions of the grid portion with respect to the total lateral cross section area of the diode is adjusted for adjusting the resistance of the grid portion.

7. A method according to claim 6, wherein said relation is changed to decrease for increasing the resistance of the grid portion of the diode.

8. A method according to claim 1, wherein in step 1) the doping concentration of the drift layer is increased with respect to the maximum doping concentration allowed for a diode without any grid portion for lowering the resistance of the drift layer and the on-state losses of the diode at a given voltage blocking capability of the diode.

9. A method according to claim 8, wherein the doping concentration of the drift layer is increased to be above about $10^{17}$ cm$^{-3}$.

10. A method according to claim 1, wherein said material is SiC.

11. A method according to claim 1, wherein the diode having a voltage blocking capability in a range of about 600–3500 V is produced.

12. A method according to claim 1, wherein the diode having the drift layer doped by donors is produced.

13. A method according to claim 12, wherein the doping concentration of said n-type drift layer is in a range of about $10^{15}$–$10^{17}$ cm.

14. A method according to claim 12, wherein the p-type emitter layer regions are given a doping concentration in a range of about $10^{17}$–$10^{20}$ cm$^{-3}$.

15. A junction barrier Schottky diode produced by carrying out a method according to claim 1.

16. Use of a junction barrier Schottky diode produced by carrying out a method according to claim 1 in a package in parallel with other such diodes for sharing a current through said package.

17. Use of a junction barrier Schottky diode produced by carrying out a method according to claim 1 in a package in parallel with other such diodes for sharing a current through said package, for blocking voltages in a range of about 1200–1800 V when the package is reverse biased, and for a current density being as low as about 150 A/cm$^2$ in the on-state of the diode.

18. A method according to claim 1, wherein a diode having a voltage blocking capability in a range of about 600 and 1500 V is produced.

19. A method for control ling ,the temperature dependence of a junction barrier Schottky diode of a semiconductor material having an energy gap between the valence band and the conduction band exceeding 2 eV, wherein the following steps are carried out when producing the diode:

1) epitaxially growing on top of each other the following semi conductor layers of said material: a substrate layer being highly doped according to a first conductivity type, n or p, and a drift layer being low doped according to said first conductivity type, 2) introducing dopants of a second conductivity type, n or p, opposite to the first conductivity type into the drift layer in regions laterally spaced to form doped emitter layer regions in the drift layer at a vertical distance from the substrate layer for defining a grid portion of the diode there, and 3) applying a metal layer on top of the drift layer to make a Schottky contact thereto and on top of at least one of the emitter layer regions to make a contact thereto, wherein at least step 2) is carried out for adjusting the on-state resistance of the grid portion of the diode for obtaining a temperature dependence of the operation of the diode adapted to the intended use thereof, and wherein in step 1) the resistance of said grid portion of the diode is adjusted by adjusting the doping concentration of drift layer regions later in step 2) becoming a part of said grid portion.

20. A method for controlling the temperature dependence of a junction barrier Schottky diode of a semiconductor material having an energy gap between the valence band and the conduction band exceeding 2 eV wherein the following steps are carried out when producing the diode:

1) epitaxially growing on top of each other the following semi conductor layers of said material: a substrate layer being highly doped according to a first conductivity type n or p, and a drift layer being low doped according to said first conductivity type, 2) introducing dopants of a second conductivity type, n or p, opposite to the first conductivity type into the drift layer in regions laterally spaced to form doped emitter layer regions in the drift layer at a vertical distance from the substrate layer for defining a grid portion of the diode there, and 3) applying a metal layer on top of the drift layer to make a Schottky contact thereto and on top of at least one of the emitter layer regions to make a contact thereto, wherein at least step 2) is carried out for adjusting the on-state resistance of the grid portion of the diode for obtaining a temperature dependence of the operation of the diode adapted to the intended use, and wherein in step 2) the relation between the lateral cross section area of said drift layer regions of the grid portion with respect to the total lateral cross section area of the diode is adjusted for adjusting the resistance of the grid portion.

21. A method for controlling the temperature dependence of a junction barrier Schottky diode of a semiconductor material having an energy gap between the valence band and the conduction band exceeding 2 eV, wherein the following steps are carried out when producing the diode:

1) epitaxially growing on top of each other the following semi conductor layers of said material: a substrate layer being highly doped according to a first conductivity type, n or p, and a drift layer being low doped according to said first conductivity type, 2) introducing dopants of a second conductivity type, n or p, opposite to the first conductivity type into the drift layer in regions laterally spaced to form doped emitter layer regions in the drift layer at a vertical distance from the substrate layer for defining a grid portion of the diode there, and 3) applying a metal layer on top of the drift layer to make a Schottky contact thereto and on top of at least one of the emitter layer regions to make a contact thereto.

wherein at least step 2) is carried out for adjusting the on-state resistance of the grid portion of the diode for obtaining a temperature dependence of the operation of the diode adapted to the intended use thereof, and wherein in step 1) the doping concentration of the drift layer is increased with respect to the maximum doping concentration allowed for a diode without any grid portion, or drift layer thickness is decreased with respect to the minimum thickness allowed for a diode without any grid portion, for lowering the resistance of the drift layer and the on-state losses of the diode at a given voltage blocking capability of the diode.

22. A method according to claim 21, wherein said material is SiC.

* * * * *